United States Patent [19]

Ku et al.

[11] Patent Number: 5,773,082
[45] Date of Patent: Jun. 30, 1998

[54] METHOD FOR APPLYING PHOTORESIST ON WAFER

[75] Inventors: Chi-Fa Ku, Kaohsiung Hsien; Chih-Hsing Hsin, Tao-Yuan Hsien; Po-Wen Yen, Hsinchu City, all of Taiwan

[73] Assignee: United Microelectronics Corp., Hsinchu, Taiwan

[21] Appl. No.: 783,906

[22] Filed: Jan. 16, 1997

[51] Int. Cl.⁶ .................................................. B05D 3/12
[52] U.S. Cl. ................... 427/240; 427/385.5; 437/231
[58] Field of Search ............................... 427/240, 385.5; 437/231

[56] References Cited

U.S. PATENT DOCUMENTS 4,741,926  5/1988  White et al. ............................. 427/240

*Primary Examiner*—Janyce Bell
*Attorney, Agent, or Firm*—Bacon & Thomas

[57] ABSTRACT

A method for applying photoresist on a wafer is disclosed. The method comprises: lowering the temperature of the photoresist, and dispensing the photoresist on a portion of the wafer, where the wafer is supported by a spinner chuck and is rotated at a low speed. Thereafter, spreading the photoresist on the wafer by rotating the wafer at a high speed. Finally, planarizing the photoresist by rotating the wafer at a medium speed greater than or equal to the low speed in the dispensing step and less than or equal to the high speed in the spreading step.

13 Claims, 5 Drawing Sheets

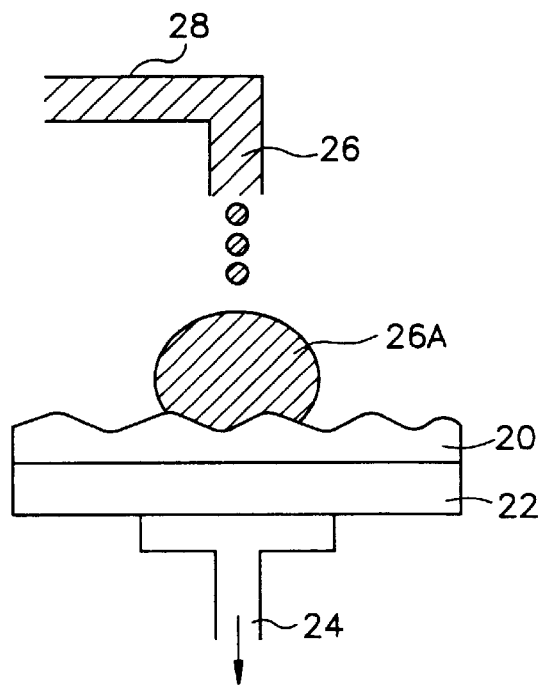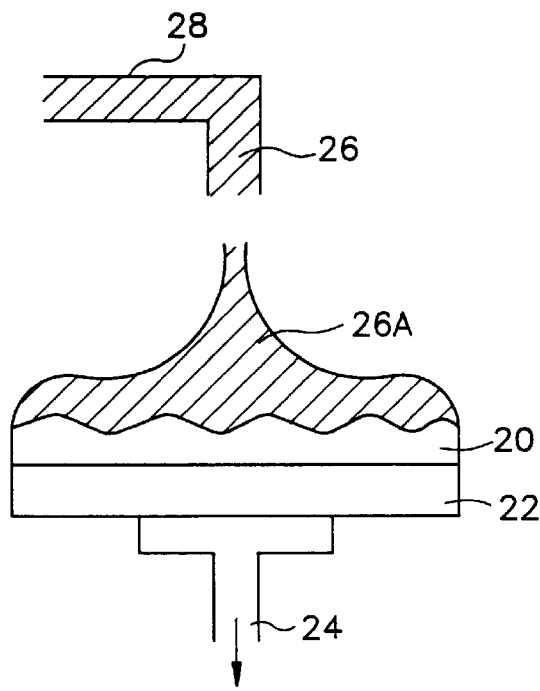
FIG. 2A
(Prior Art)
FIG. 2C
(Prior Art)
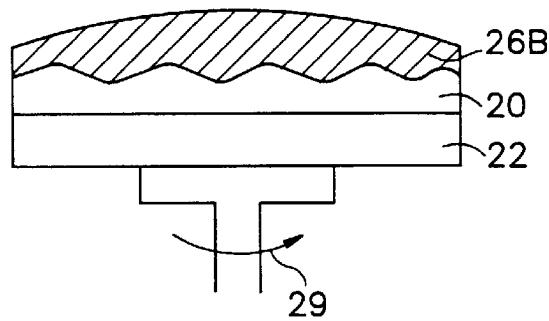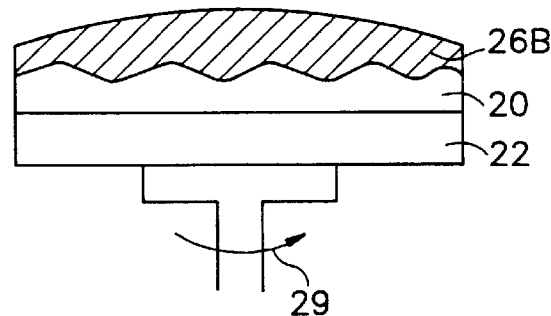
FIG. 2B
(Prior Art)
FIG. 2D
(Prior Art)

METHOD FOR APPLYING PHOTORESIST ON WAFER

BACKGROUND OF THE INVENTION

1. Field of the Invention

The present invention relates to a method for applying photoresist on a wafer, and especially to a photoresist spinning method for improving the critical dimensions (CD) uniformity of an integrated circuit design.

2. Description of the Prior Art

Photolithography is one of the most important processes for fabricating a very large scale integrated circuit. The goal of the photolithography is the patterning process that removes specific portions of the upper layer or layers for setting the horizontal dimensions on the various parts of the circuit. Through several steps of photoresist application, photomasks alignment, photoresist exposure and layer etching, the final pattern is then created. The first purpose of patterning is to make sure that the dimensions of the resultant pattern on the circuit are close to the design requirements. The requirements for rigorously controlling the dimensions to ensure that the circuit operates within the design specifications are typically called critical dimensions (CD). The difference between the linewidth of the patterned circuit and that of the photomask is referred to as bias or deviation, and is closely related to the tolerance which greatly impacts circuit performance. Therefore, critical dimensions are monitored frequently on the photoresist and the resultant wafer patterns. Another purpose of patterning is the correct alignment of the circuit pattern on the wafer. Noticeably, even a misaligned mask layer can cause the entire circuit to fail.

Photoresist has been adapted by semiconductor industry in the 1950s and becomes the heart of the photolithography process. Polymer is one of the ingredients of the photoresist. The polymer dedicated to semiconductor patterning process reacts to some types of light energy such as ultraviolet. There are two major types of photoresists: negative photoresist and positive photoresist. Negative photoresists are based on the polyisopreme polymer. The exposed portion of this polyisopreme polymer becomes polymerized and is then used as a resistance to etchants. However, the positive photoresists are based on the phenol-formaldehyde polymer. Contrary to the negative photoresists, the exposed portion of this phenol-formaldehyde polymer becomes more soluble while the unexposed portions remain insoluble.

Solvent is another ingriedent of the photoresists. The solvent is used to make the photoresist a liquid, which makes the application of a thin photoresist layer onto a wafer attainable. Usually, some sensitizers such as bis-aryldiazide are added to the photoresist for providing a broader or a narrower response range.

The goal of the photoresist application process is to achieve a thin, uniform layer of photoresist on a wafer surface. This achievement requires sophisticated equipment and strict controls. Typically, a uniformity of 100 angstroms variation is required for a photoresist layer having a thickness of 7000 to 30000 angstroms.

In order to achieve a uniform photoresist layer, it is a typical way to get a recipe consisting of factors such as temperature, humidity or spinning speed by applying the photoresist 12 onto a bare wafer 10 as shown in FIG. 1A. Afterwards, this recipe is applied to a device wafer, which is the wafer with some devices formed on the wafer. Owing to the rugged surface of the device wafer, the topography of the photoresist 16 on the device wafer 14 is not uniform as shown in FIG. 1B. A circuit line near the center portion of the photoresist layer has a greater line width than the defined line critical dimension. On the contrary, a hole near the center portion of the photoresist layer has a smaller radius than the defined hole critical dimension. This critical dimensional non-uniformity makes the alignment more difficult to achieve, and greatly degrades the circuit performance and function. Moreover, as the wafer size increases and the device grows denser, the aforementioned effects dominate the performance of the circuit.

FIGS. 2A and 2B show a conventional method for applying photoresist on a wafer 20. As shown in FIG. 2A, the wafer 20 is supported on a spinner chuck 22, which is further vacuumed 24 by a vacuum equipment (not shown in the figure). Photoresist 26 is then dispensed through a dispenser 28. Several cubic centimeters of the photoresist 26A is dispensed in the center of the wafer 20, and then the chuck 22 is rapidly accelerated 29 to a predetermined high speed. While the acceleration is exerted, centrifugal force spreads the photoresist 26 to the wafer edge and throws off excess photoresist, forming a thin layer 26B on the wafer 20 (FIG. 2B). As we mentioned before, the resultant layer 26B possesses non-uniformity when applying the photoresist on a device wafer.

The photoresist viscosity and the spin speed are two major factors for establishing the final thickness of the layer 26B. During the photoresist spinning, the ambient temperature and humidity are maintained constant, and the temperature of the dispensed photoresist 26 is about 23.2° C.

Another technique called dynamic dispense for applying the photoresist onto a wafer is devised as shown in FIGS. 2C and 2D. The difference between the dynamic dispense method and the previous static spin method is that the wafer 20 is rotated at a low speed of about 500–1800 revolutions per minute (rpm) during the photoresist dispension step (FIG. 2C) in the dynamic dispense method. However, during the spreading process, two methods perform the same acceleration operation 29 in order to form a layer 26B (FIG. 2D) of specific thickness. During the photoresist spinning, the ambient temperature and humidity are maintained constant, and the temperature of the dispensed photoresist 26 is about 23.2° C. Although the dynamic dispense method has a better uniformity than the static spin method, the dynamic dispense method still cannot achieve a uniform photoresist layer on a device wafer whose size is eight inches or lager.

SUMMARY OF THE INVENTION

According to the present invention, a method for applying photoresist on a wafer is disclosed. The method comprises: dispensing the photoresist on a portion of the wafer, where the wafer is supported by a spinner chuck and is rotated at a low speed. Thereafter, spreading the photoresist on the wafer by rotating the wafer at a high speed for about 0 to 4 seconds. Finally, planarizing the photoresist by rotating the wafer at a medium speed of 1700 to 5000 revolutions per minute, wherein the medium speed is greater than the low speed in the dispensing step and 0–2000 revolutions per minute less than the high speed in the spreading step.

BRIEF DESCRIPTION OF THE DRAWINGS

FIGS. 2A, 2B, 2C and FIG. 2D demonstrate two conventional methods for applying photoresist on a device wafer.

FIG. 3A demonstrates the photoresist dispense step of the present invention.

FIG. 3B demonstrates the photoresist spreading step of the present invention.

FIG. 3C demonstrate the photoresist layer forming step of the present invention.

FIG. 5A demonstrates the photoresist dispense step of the present invention.

FIG. 5B demonstrates the photoresist spreading step of the present invention.

FIG. 5C demonstrate the uniform photoresist layer forming step of the present invention.

DESCRIPTION OF THE PREFERRED EMBODIMENT

Figure 1A:
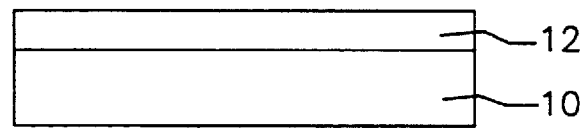
FIG. 1A shows a photoresist layer on a bare wafer.
Figure 1B:
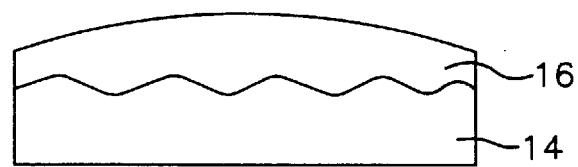
FIG. 1B shows an non-uniform photoresist layer on a device wafer.
Figure 3A:
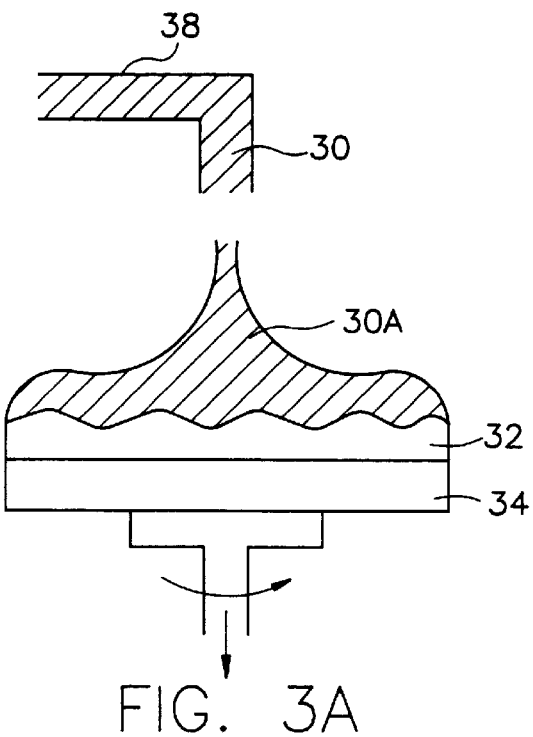
FIGS. 3A, 3B and FIG. 3C demonstrate the present invention for applying photoresist on a bare wafer.
Figure 4:
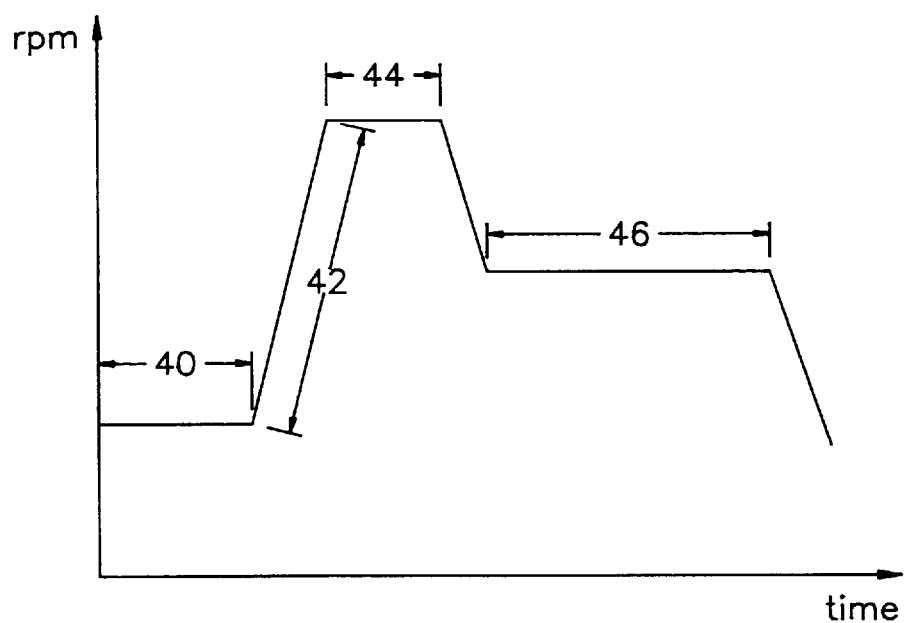
FIG. 4 shows the rotation speed for every steps in the present invention.

FIG. 3A shows the equipment for applying photoresist 30 on a bare wafer 32 using the present invention. The wafer 32 is supported by a spinner chuck 34, which is further vacuumed 36 by a vacuum equipment (not shown in the figure). While the photoresist 30 is dispensed through a dispenser 38, the wafer 32 and the spinner chuck 34 are rotated at a low speed of about 500–1800 revolutions per minute (rpm), forming the photoresist 30A on the wafer 32. A time domain diagram with rpms is shown in FIG. 4, where duration 40 corresponds to the aforementioned dispensing step. It is worth noting that the temperature of the photoresist 30 in the present invention is 0.5°–3° C. less than the temperature (23.2° C.) of the photoresist in a conventional method. The lower temperature makes the solvent in the photoresist 30A evaporate more slowly. Furthermore, this resultant lower viscosity of the photoresist 30A makes it possible to control the thickness and the topography of the photoresist 30A.

Figure 3B:
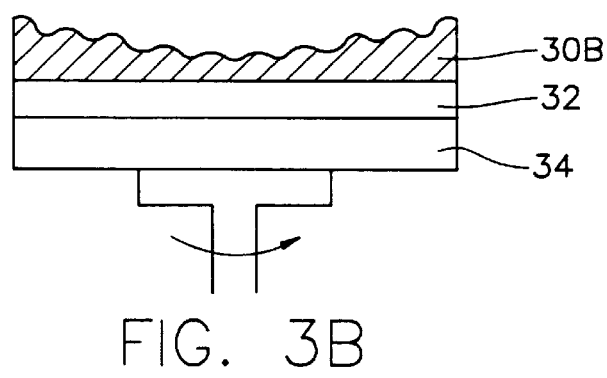

Next, the wafer 32 and the spinner chuck 34 are accelerated from the low speed to a high speed of about 1700–5000 rpm. The acceleration rate is about 5000–15000 rpm/sec. As shown in FIG. 3B, an unstable and centrally-thinned film 30B of the photoresist is formed due to that acceleration force and a centrifugal force, thereby spreading the photoresist 30B on the wafer 32. Corresponding acceleration period 42 is shown in FIG. 4. The spreading step 44 normally lasts 0 to 4 seconds for an eight-inch wafer and requires a little bit longer for a wafer larger than eight inches.

Figure 3C:
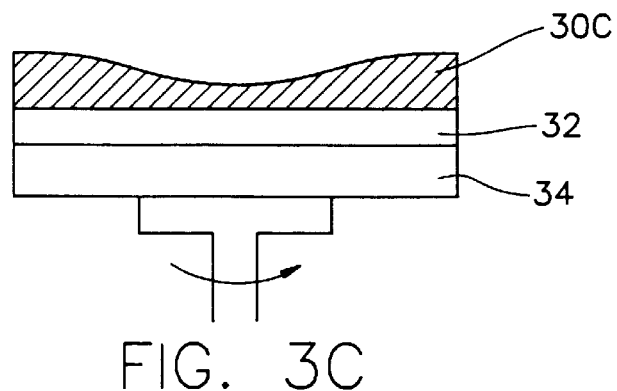

Thereafter, the wafer 32 and the spinner chuck 34 are decelerated to a medium speed, which is 0–2000 rpm less than the high speed in the previous spreading step. In the present step, a topography as shown in FIG. 3C is finally formed. The photoresist on the inner bare wafer 32 is 50–500 angstroms thinner than the photoresist on the outer bare wafer 32, which has thickness of about 7000 to 30000 angstroms. The purpose of the present step, which is corresponding to the duration 46 in FIG. 4, is to form a predetermined topography for the photoresist 30C by using the previously prepared photoresist 30B (FIG. 3B), which has an appropriate viscosity and was spreaded at a high speed.

Figure 5A:
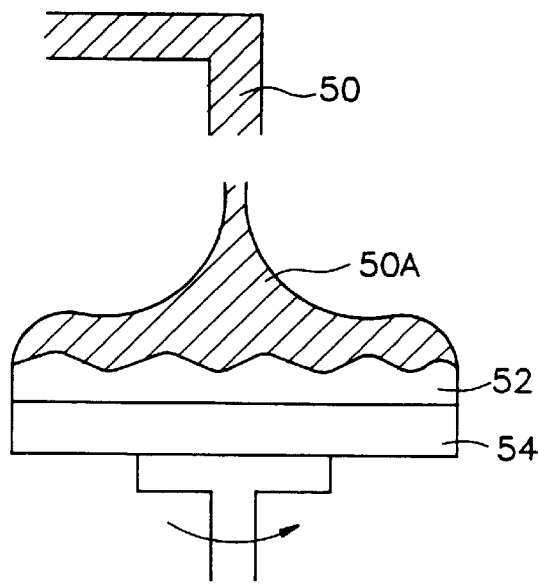
FIGS. 5A, 5B and FIG. 5C demonstrate the present invention for applying photoresist on a device wafer.
Figure 5B:
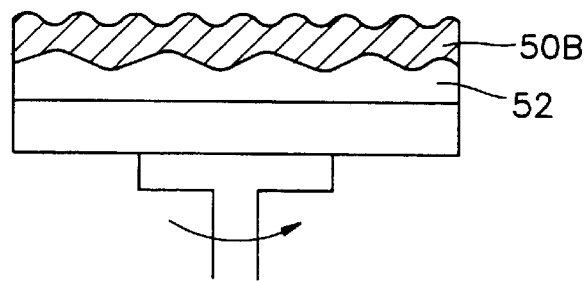
Figure 5C:
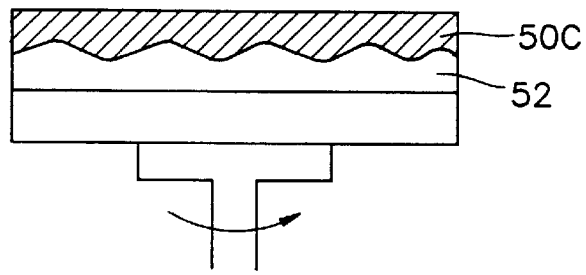

The recipe described above will be used for forming a thin, uniform layer of photoresist on a device wafer 52 as shown in FIGS. 5A to 5C. All the control parameters in FIGS. 5's are the same as those in FIGS. 3's except for the device wafer used and the resultant uniform layer 50C of photoresist. In the following, the photoresist application on the device wafer 52 is described briefly. Firstly, referring to FIG. 5A, the photoresist 50 is dispensed while the wafer 52 supported by a spinner chuck 54 is rotated at a low speed of about 500–1800 rpm, thereby forming the photoresist 50A on the device wafer 52. The temperature of the photoresist 50 is controlled in the range of 20.2°–22.7° C.

Secondly as shown in FIG. 5B, the wafer 52 is accelerated to a high speed of about 1700–5000 rpm, and the acceleration rate is about 5000–15000 rpm/sec, followed by a lasting period at the constant high speed for 0 to 4 seconds. A spreaded flattened unstable film 50B is thus formed on the device wafer 52.

Finally as shown in FIG. 5C, the wafer 52 is decelerated to a medium speed, which is 0–2000 rpm less than the high speed in the previous spreading step. After about an half minute, a thin (7000–30000 angstroms), uniform layer of the photoresist 50C is then formed. After using the present invention for applying photoresist on an eight-inch device wafer, the uniformity is improved largely with 25 angstroms deviation from the critical dimension, compared to 40–50 angstroms in the conventional method.

Although specific embodiments have been illustrated and described it will be obvious to those skilled in the art that various modifications may be made without departing from the spirit which is intended to be limited solely by the appended claims.

What is claimed is:

1. A method for applying photoresist on a wafer, said method comprising:

dispensing said photoresist on a portion of the wafer, said wafer is supported by a spinner chuck and said wafer is rotated at a first speed:

spreading said photoresist on the wafer by rotating the wafer at a second speed higher than the first speed, wherein an acceleration having an acceleration rate of about 5000 to 15000 revolutions per minute is exerted on the wafer, so that the first speed is changed to the second speed; and planarizing said photoresist by rotating the wafer at a medium speed greater than or equal to said first speed in the dispensing step and less than or equal to said second speed in the spreading step.

2. The method according to claim 1, wherein the duration of the spreading step is about 0 to 4 seconds.

3. The method according to claim 1, wherein said medium speed is about 1700 to 5000 revolutions per minute.

4. The method according to claim 1, after the planarization step, wherein the thickness of said photoresist is about 7000 to 30000 angstroms.

5. A method for applying photoresist on a bare wafer, said method comprising:

dispensing said photoresist on a portion of the bare wafer, said bare wafer is supported by a spinner chuck and said bare wafer is rotated at a first speed;

spreading said photoresist on the bare wafer by rotating the bare wafer at a second speed higher than the first speed, wherein an acceleration having an acceleration rate of about 5000 to 15000 revolutions per minute is exerted on the wafer, so that the first speed is changed to the second speed; and rotating the bare wafer at a medium speed greater than said first speed in the dispensing step and less than said second speed in the spreading step, thereby making the thickness of said photoresist on the inner bare wafer less than the thickness of said photoresist on the outer bare wafer.

6. The method according to claim 5, wherein the duration of the spreading step is about 0 to 4 seconds.

7. The method according to claim 5, wherein said medium speed is about 1700 to 5000 revolutions per minute.

8. The method according to claim 5, after the rotation step at the medium speed, wherein the thickness of said photoresist on the outer bare wafer is about 7000 to 30000 angstroms.

9. The method according to claim 5, after the rotation step at the medium speed, wherein said photoresist on the inner wafer is about 50–500 angstroms thinner than said photoresist on the outer bare wafer.

10. A method for applying photoresist on a wafer, said method comprising:

dispensing said photoresist on a portion of the wafer, said wafer is supported by a spinner chuck and said wafer is rotated at a first speed;

spreading said photoresist on the wafer by rotating the wafer at a second speed higher than the first speed for about 0 to 4 seconds; and planarizing said photoresist by rotating the wafer at a medium speed of 1700 to 5000 revolutions per minute, said medium speed is greater than said first speed in the dispensing step and about 0–2000 less than said second speed in the spreading step.

11. The method according to claim 10, wherein the temperature of said dispensed photoresist is about 20.2° to 22.7° C.

12. The method according to claim 10, wherein an acceleration having an acceleration rate of about 5000 to 15000 revolutions per minute is exerted on the wafer, so that the first speed is changed to the second speed.

13. The method according to claim 10, after the planarization step, wherein the thickness of said photoresist is about 7000 to 30000 angstroms.

* * * * *